US007018731B2

(12) United States Patent
Maloize

(10) Patent No.: US 7,018,731 B2
(45) Date of Patent: Mar. 28, 2006

(54) END-OF-DISCHARGE CONTROL APPARATUS FOR A BATTERY OF RECHARGEABLE ELECTROCHEMICAL CELLS

(75) Inventor: Serge Maloize, Trois Palis (FR)

(73) Assignee: Alcatel, Paris (FR)

( * ) Notice: Subject to any disclaimer, the term of this patent is extended or adjusted under 35 U.S.C. 154(b) by 321 days.

(21) Appl. No.: 10/347,734

(22) Filed: Jan. 22, 2003

(65) Prior Publication Data

US 2003/0235754 A1 Dec. 25, 2003

Related U.S. Application Data

(60) Provisional application No. 60/352,507, filed on Jan. 31, 2002.

(51) Int. Cl.
*H01M 10/46* (2006.01)

(52) U.S. Cl. ............................ 429/7; 429/61; 429/149; 320/136

(58) Field of Classification Search .................... 429/7, 429/61, 149; 320/134, 135, 136
See application file for complete search history.

(56) References Cited

U.S. PATENT DOCUMENTS 5,994,873 A * 11/1999 Shiojima ................ 320/134 X
6,369,576 B1 * 4/2002 Matthews et al. ...... 320/136 X
6,838,857 B1 * 1/2005 Faure et al. ................ 320/134

FOREIGN PATENT DOCUMENTS

| | | | |
|---|---|---|---|
| EP | 907234 | * | 4/1999 |
| JP | 8-47178 | * | 2/1996 |
| JP | 2000-014028 | * | 1/2000 |
| WO | WO 01/59905 | * | 8/2001 |

* cited by examiner

*Primary Examiner*—Stephen J. Kalafut
(74) *Attorney, Agent, or Firm*—Sughrue Mion, PLLC

(57) ABSTRACT

A battery assembly (E) comprises firstly a battery (B) having at least one module (1-*i*) constituted by at least two secondary electrochemical cells (2-*j*) connected in series, and secondly control apparatus comprising control means (4) for acting at the end of charging the battery (B) to determine the number of cells (1-*i*) that are in working condition in each module (2-*j*) and then for determining a threshold voltage value for each module (1-*i*) as a function of said number, and finally for acting at the end of discharge of the battery (B) to compare an end-of-discharge voltage measured across the terminals of each module (1-*i*) with the corresponding threshold voltage as previously determined so as to interrupt operation of the battery (B) when at least one measured end-of-discharge voltage (VFD-i) is less than the corresponding value determined for the threshold voltage.

21 Claims, 1 Drawing Sheet

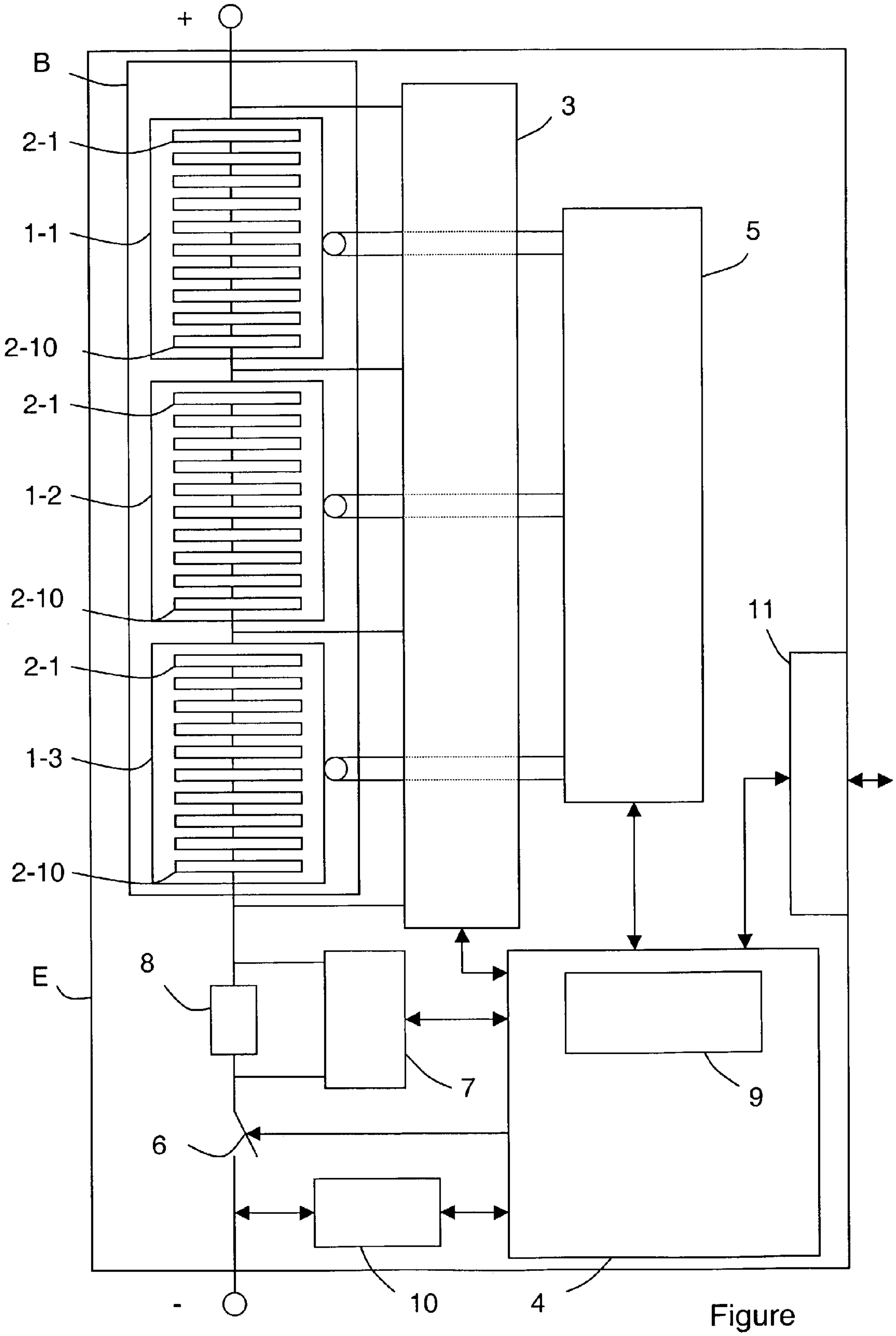
Figure

END-OF-DISCHARGE CONTROL APPARATUS FOR A BATTERY OF RECHARGEABLE ELECTROCHEMICAL CELLS

This application claims benefit of Provisional Application No. 60/352,507, filed Jan. 31, 2002; the disclosure of which is incorporated herein by reference.

The invention relates to the field of batteries of electrochemical cells, and more particularly to the field of apparatus for controlling the end of discharge in certain rechargeable batteries constituted by modules connected in series, the modules comprising rechargeable or "secondary" electrochemical cells (also known as "accumulators").

BACKGROUND OF THE INVENTION

In order to avoid certain batteries being subjected to excessive discharge which might damage them by "inversion", proposals have been made to fit such batteries with end-of-discharge control apparatus. That type of apparatus generally comprises control means serving, at the end of discharge, firstly to measure the voltage across the terminals of each module of the battery, then to compare said end-of-discharge voltages with a module threshold voltage referred to as a "stop" voltage, so as to be able to interrupt operation of the battery when at least one of said measured voltages is below its stop voltage. Such apparatus is described in particular in patent document SU-1 686 539.

That type of control apparatus is entirely suitable for batteries comprising modules each having a small number of cells, and to applications in which the current and/or temperature ranges involved are small. However, when the battery voltage becomes large, typically greater than about 20 volts (V), that type of control apparatus can become troublesome. When one of the cells in a module is short circuited, in particular because of premature wear or failure, the voltage measured across the terminals of the faulty module becomes less than the voltages measured across the terminals of the other modules. Consequently, once the control apparatus discovers that the voltage across the terminals of the faulty module is less than the stop voltage, it interrupts operation of the battery even though non-negligible usable capacity still remains in the battery.

For example, in a battery comprising three modules each comprising ten cells presenting an average voltage of 1.2 V, when one of the cells in one module is short circuited, the mean voltage of the battery is equal to 34.8 V instead of 36 V, which represents a voltage loss of about 3.3%. If such a battery is fitted with control apparatus configured for a stop voltage of 10.5 V, so as to prevent end-of-discharge inversions when battery capacity has changed to about 18% for low discharge current and to about 90% for maximum discharge current, then said apparatus will very quickly detect that the module operating on nine out of ten cells presents a voltage lower than the stop voltage, and will consequently decide to interrupt operation of the entire battery, even though it still has usable capacity lying in the range about 18% to about 90% and has lost only 3.3% of its voltage.

OBJECTS AND SUMMARY OF THE INVENTION

An object of the invention is thus to remedy that drawback.

For this purpose, the invention provides apparatus dedicated to controlling the end of discharge of a battery fitted with at least one module having at least two secondary electrochemical cells connected in series, the apparatus comprising control means for acting at the end of battery discharge to compare the voltage measured across the terminals of each module with a module threshold voltage in order to interrupt the operation of the battery when at least one measured voltage is less than the module threshold voltage.

The apparatus is characterized by the fact that the control means are capable, at the end of battery charging, of determining the number of cells that are in working condition within each module, and then in determining the value of the threshold voltage for each module (i.e. the stop voltage) for use when performing the comparison, said voltage being determined as a function at least of the number of cells in working condition.

By matching the value of the stop voltage of a battery module with the number of cells within the module that are capable of operating, it is possible to continue using all of the capacity available in the cells that remain in working condition, while preventing them from being subjected to inversion at the end of discharge.

According to another characteristic of the invention, the control means are capable of determining the value of each module threshold voltage (or stop voltage) for use in performing the comparison as a function of the number of cells in working condition and of a cell threshold voltage representing the end-of-discharge voltage of a single cell, also referred to as the "unit" voltage.

In a preferred embodiment, the apparatus comprises electrical measurement means for measuring end-of-discharge voltages and end-of-charging voltages across the terminals of each battery module, and its control means are arranged in such a manner as to determine the number of cells that are in working order within each of the modules on the basis of the voltage measured at the end of charging across their respective terminals, and possibly also on the basis of a nominal (ideal) voltage value corresponding to the end-of-charging voltage across the terminals of a single cell.

The apparatus of the invention may comprise other additional characteristics which can be taken separately and/or in combination, and in particular:

- electrical measurement means measuring end-of-discharge voltage when the battery presents current that is substantially zero;
- means for measuring the temperature of each module such that the control means can determine the number of cells in working condition in each of the modules on the basis of the end-of-charging voltage measured across their terminals and of the nominal voltage value associated with a cell, as corrected by a first correction factor which is a function of the measured temperature of the module;
- means for measuring the discharge current of the battery so that the control means can determine the value of each module threshold voltage (or stop voltage) as a function of the number of cells in working condition within the module concerned and of the cell threshold voltage (or unit voltage) of the module as corrected by a second correction factor which is a function of the discharge current and of the value of the impedance of a cell. Under such circumstances, it is advantageous for the control means to be arranged in such a manner as to correct the value of the impedance of a cell in a module by at least a third correction factor which is a function of the temperature of the module;

control means arranged so as to correct the threshold voltage of a module by at least a fourth correction factor which is a function of the temperature of the module;

control means arranged in such a manner as to determine the value of the impedance of a cell in a module as a function firstly of a variation in the voltage across the terminals of the module over a selected time interval and secondly of a corresponding variation in the current through the battery over said time interval;

a memory for storing the nominal values and certain nominal parameters of cells used in each of the correction factors, and possibly also at least some of the values that are determined;

a communications interface coupled to the control means;

a switch for allowing or preventing current to flow through the battery as a function of instructions received from the control means; and detector means for detecting the presence of an external system connected to the terminals of the battery, for example a battery charger or apparatus constituting a load.

The invention also provides a battery assembly comprising at least one battery of modules of secondary electrochemical cells connected in series together with control apparatus of the type described above.

Furthermore, the invention is particularly adapted to batteries and to battery assemblies in which the electrochemical cells are selected from a group comprising at least: alkaline cells, in particular nickel/metal hydride (Ni/MH) cells and nickel/cadmium (Ni/Cd) cells; and lithium cells, and in particular lithium/ion (Li/ion) cells.

BRIEF DESCRIPTION OF THE DRAWING

Other characteristics and advantages of the invention appear on examining the following detailed description and the sole accompanying FIGURE which is a circuit diagram of one example of a battery assembly fitted with control apparatus of the invention. Not only does the FIGURE contribute to describing the invention, it may also contribute to defining it, where appropriate.

MORE DETAILED DESCRIPTION

The battery assembly E shown by way of example in the sole FIGURE comprises firstly a battery B of modules 1-*i* (in this case i=1 to 3) connected in series and made up of rechargeable (or "secondary") electrochemical cells 2-*j* (in this case j=1 to 10), likewise connected in series. These rechargeable cells 2-*j* are preferably of the alkaline type, being constituted for example by nickel/metal hydride (Ni/MH) cells or by nickel/cadmium (Ni/Cd) cells. However the cells could also be non-aqueous cells such as lithium cells, for example, and in particular lithium/ion cells (Li/ion). In the specification below, it is assumed that the rechargeable cells 2-*j* are of the nickel/metal hydride (Ni/MH) type.

Naturally, the invention is not limited to the number of modules shown. It relates to all batteries of the above-specified type comprising at least one module. In addition, the invention is not limited to modules made up of ten cells. It relates to all battery modules made up of at least two cells.

In order to control discharge of the battery B, the battery assembly E includes control apparatus comprising firstly an electrical measurement module 3 for measuring the voltage across the terminals of each of the modules 1-*i* of the battery B, for example continuously or periodically. Of these measurements, particular mention can be made of measurements VFC-i performed at the end of battery charging, and measurements VFD-i performed at the end of battery discharge. The end-of-discharge voltages VFD-i are preferably measured at zero current.

The control apparatus further comprises a control module 4 for acting at the end of discharge of the battery B to compare each end-of-discharge voltage VFD-i measured by the electrical measurement module 3 across the terminals of each module 1-*i* with a previously determined module threshold voltage TS1-*i* in order to interrupt operation of the battery B when at least one of the measured voltages VFD-i is less than the value determined for the threshold voltage of the corresponding module TS1-*i*.

In the invention, each module threshold voltage TS1-*i* is determined by the control module 4 at the end of charging the battery B. To do this, the control module 4 begins by determining the number Ni of cells 2-*j* that are in working condition within each module 1-*i* at the end of charging, and then determines the value for the threshold voltage of each module TS1-*i* as a function at least of the number Ni of cells 2-*j* in working condition. For example, when module 1-*i* is made up of ten cells 2-1 to 2-10 all presenting mean voltages equal to about 1.2 V, then the module threshold voltage TS1-*i* is equal to 10.5 V.

Preferably, the control module 4 determines the value of each module threshold voltage TS1-*i* not only as a function of the number Ni of cells 2-*j* in working condition, but also as a function of a cell threshold voltage TS2. This cell threshold voltage TS2 is a nominal (ideal) value corresponding to the discharge stop voltage of a single cell 2-*j*, also referred to as the unit voltage. In the above-described example, the cell threshold voltage (or unit voltage) TS2 is selected to be substantially equal to 1.05 V.

The number of cells 2-*j* in working condition within each module 1-*i* is determined at the end of charging by the equation (1):

$$Ni = VFC\text{-}i/VG \qquad (1)$$

where VG is a nominal (ideal) value corresponding to the voltage of a cell 2-*j* at the end of charging. It is equal to 1.4 V in the above-described example.

However, the control module 4 may use an equation that is more complex when, as shown in the single FIGURE, the control apparatus is fitted with a temperature measuring module 5 for measuring the temperature of each module 1-*i*. Under such circumstances, equation (1) can be replaced by equation (1') for example:

$$Ni = VFC\text{-}i/[VG + (K1 \times (Ti - 25^\circ\ \text{C.}))] \qquad (1')$$

where K1×(Ti−25° C.) is a first correction factor for correcting the nominal voltage VG as a function of the measured temperature Ti of the module 1-*i* and of a selected constant K1.

Naturally, the number of cells 2-*j* in working condition within each module 1-*i* could be determined in some other way. Thus, each cell 2-*j* could be fitted with means for indicating that it is in operation.

The value of each module threshold voltage TS1-*i* (or stop voltage) is preferably determined by the control module 4 using equation (2):

$$TS1\text{-}i = TS2 \times Ni \qquad (2)$$

When the control module 4 has finished determining the value for each module threshold voltage TS1-*i*, it can proceed with comparing each end-of-discharge voltage VFD-i measured across the terminals of the module 1-*i* with the corresponding module threshold voltage value TS1-*i* so as to interrupt operation of the battery B when at least one of the measured voltages VFD-i is less than the corresponding module threshold voltage value TS1-*i*. In order to enable the control module 4 to interrupt operation of the battery, the control apparatus further comprises an interrupter (or switch) 6 placed in series with one of the terminals of the battery B (in this case the "−" terminal) and coupled to said control module 4.

When the battery B is to deliver a wide range of discharge currents (I), it is advantageous for the control apparatus to include a current measurement module 7 including a resistor or "shunt" 8 connected in series with one of the two terminals of the battery B (in this case the "−" terminal), and coupled to the control module 4 to provide measurements I representative of the discharge current of the battery B. Under such circumstances, equation (2) used by the control module 4 for determining the value of each module threshold voltage TS1-*i* may be replaced by equation (2'), for example:

$$TS1\text{-}i=[TS2'-(R\times I)]\times Ni \qquad (2')$$

where R is the impedance of a cell 2-*j* and TS2' is the cell threshold voltage without current (or unit voltage without current).

Furthermore, when the battery B is to operate over a large temperature range (Ti), it is advantageous for the equation (2') used by the control module 4 for determining the value of each module threshold voltage TS1-*i* to be replaced by equation (2'), for example:

$$TS1\text{-}i=[TS2''+(K3\times(Ti-25^\circ\ C.))-(R+(K2\times(Ti-25^\circ\ C.)))\times I]\times Ni \qquad (2'')$$

where K2×(Ti−25° C.) is a third correction factor for correcting the impedance R as a function of the measured temperature Ti of module 1-*i* and of a selected constant K2, and where K3×(Ti−25° C.) is a fourth correction factor for correcting the generator threshold voltage TS2 (or unit voltage) as a function of the measured temperature Ti of the module 1-*i* and a selected constant K3, and where TS2'' is the cell threshold voltage without current at 25° C.

In addition, in order to improve the accuracy with which module threshold voltages TS1-*i* are determined, the control module 4 may be arranged in such a manner as to use a variable impedance value R instead of a predefined value. For example, the impedance value R of a module cell may be determined by the control module 4 using equation (3) for example:

$$R=(V2-V1)/(I2-I1) \qquad (3)$$

where V1 and V2 represent voltage values measured by the electrical measurement module 3 across the terminals of a module 1-*i* at instants t1 and t2, and I1 and I2 represent currents measured by the current measurement module 7 at one of the two terminals of the battery B (in this case the "−" terminal) at said instants t1 and t2.

The control apparatus 4 preferably includes a memory 9 (in this case implanted in the control module 4) for storing all of the parameters and constants (TS2, TS2', TS2'', VG, K1, K2, and K3) involved in calculating the variables (TS1-*i*, Ni, and R) governed by above-specified equations (1) to (3).

The memory 9 may also be used to store measured end-of-charging voltage values VFC-i, end-of-discharge voltages VFD-i, the voltages V1 and V2, the discharge currents I1 and I2, and the temperatures Ti, and also the determined (or calculated) values for the numbers Ni of generators 2-*j* in working condition within each module 1-*i*, and the module threshold voltages TS1-*i*. This can enable the control module 4 to establish statistics and/ or to generate alarms if it detects a problem.

The control apparatus may also comprise a detector module 10 placed on one of the terminals of the battery B (in this case the "−" terminal) for the purpose of informing the control module 4 when an external system such as a battery charger or apparatus constituting a load, for example, is connected to the "−" and "+" terminals of the battery B. The detector module 10 makes it possible in particular to switch on the switch 6 so as to allow the battery B to be charged when it is connected to a battery charger.

Finally, the control apparatus may also have a communications interface 11 enabling data to be exchanged with external communications equipment adapted for this purpose, for example a portable microcomputer, or a personal digital assistant (PDA), or indeed a dedicated unit. Any type of interface could be used whether wired or wireless, and in particular it is possible to use male or female connectors, radio transceivers (including Bluetooth or IEEE 802.11 (or WiFi) type equipment), or infrared equipment. By means of this communications interface 11, it is possible not only to make the information stored in the memory 9 available to external equipment, but also to supply parameters and constants that are of use to the control module 4 for storing in the memory 9. This can also enable the control module 4 to be reconfigured (or reprogrammed) as a function of the requirements and the type of battery with which it is associated.

The control module 4 and all or some of the electrical measurement modules 3, the temperature measurement module 5, the current measurement module 7, and the presence detector module 10, and possibly also the memory 9, may be implemented in the form of electronic circuits (i.e. "hardware"), or in the form of programs or computer modules (i.e. "software"), or a combination of hardware and software.

In the above description, examples are given of measured voltages and threshold voltages that are appropriate for batteries made up of rechargeable cells of the nickel/metal hydride (Ni/MH) type. Naturally, when the cells are of some other type, for example lithium cells, other voltage values corresponding thereto.

The invention is not limited to the embodiments of control apparatus and battery assemblies as described above purely by way of example, but covers any variant that can be envisaged by the person skilled in the art within the ambit of the following claims.

Thus, the control apparatus of the invention may include display means, for example a liquid crystal display (LCD) type screen or the like, optionally associated with a keypad, so as to enable the parameters and information stored in its memory to be read and/or so as to enable new operating parameters to be input.

What is claimed is:

1. Apparatus for controlling the end of discharge of a battery (B), the battery comprising at least one module (1-*i*) made up of at least two secondary electrochemical cells (2*j*) connected in series, said apparatus comprising control means (4) arranged to act at the end of discharge of said battery (B) to compare an end-of-discharge voltage (VFD-i)

measured across the terminals of each module (1-*i*) with a module threshold voltage value (TS1-*i*) so as to interrupt operation of said battery when at least one measured end-of-discharge voltage (VFD-i) is less than said module threshold voltage value (TS1-*i*), wherein said control means (4) are arranged, at the end of charging said battery (B), to determine the number of cells (1-*i*) that are in working condition in each module (2-*j*), and then to determine each module threshold voltage value (TS1-*i*) for use in performing said comparison as a function of said number of cells (2*j*) in working condition.

2. Apparatus according to claim 1, in which said control means (4) are arranged to determine each module threshold voltage value (TS1-*i*) used for performing said comparison as a function of said number of cells (2-*j*) in working condition and of a cell threshold voltage (TS2).

3. Apparatus according to claim 1, including electrical measurement means (3) arranged to measure said end-of-discharge voltages (VFD-i) and end-of-charging voltages (VFC-i) across the terminals of each of said modules (1-*i*), and in which said control means (4) are arranged to determine said number of cells (2-*j*) in working condition within each of said modules (1-*i*) from the end-of-charging voltage (VFC-i) measured at their terminals.

4. Apparatus according to claim 3, in which said control means (4) are arranged to determine said number of cells (2-*j*) in working condition within each of said modules (1-*i*) from the end-of-charging voltage (VFC-i) measured at their terminals and from a nominal voltage value (VG) corresponding to the end-of-charging voltage across the terminals of a cell (2-*j*).

5. Apparatus according to claim 3, in which said electrical measurement means (3) are arranged to act at the end of discharge to measure said voltages (VFD-i) across the terminals of each of said modules (1-*i*) while said battery (B) is presenting substantially zero current.

6. Apparatus according to claim 1, including temperature measurement means (5) arranged to determine the temperature (Ti) of each module (1-*i*), wherein said control means (4) are arranged to determine said number of cells (2-*j*) in working condition within each of said modules (1-*i*) from said end-of-charging voltage (VFC-i) measured at their terminals and from said nominal voltage value associated with said cell (VG) as corrected by a first correction factor which is a function of said measured temperature (Ti) of said module (1-*i*).

7. Apparatus according to claim 6, in which said control means (4) are arranged to correct said impedance value (R) of a cell (2-*j*) of a module (1-*i*) by at least a third correction factor which is a function of said module temperature (Ti).

8. Apparatus according to claim 2, including current measurement means (7, 8) arranged to determine the discharge current (I) of said battery (B), wherein said control means (4) are arranged to determine each module threshold voltage value (TS1-*i*) as a function of said number of cells (2-*j*) in working condition within said module (1-*i*) and of said cell threshold voltage (TS2) of said module (1-*i*) as corrected by a second correction factor which is a function of said discharge current (I) and of the impedance value (R) of said cell (2-*j*).

9. Apparatus according to claim 8, in which said control means (4) are arranged to correct said impedance value (R) of a cell (2-*j*) of a module (1-*i*) with at least a third correction factor which is a function of said module temperature (Ti).

10. Apparatus according to claim 9, in which said control means (4) are arranged to correct said cell threshold voltage (TS2) of a module (1-*i*) with at least a fourth correction factor which is a function of said module temperature (Ti).

11. Apparatus according to claim 8, in which said control means (4) are arranged to determine said impedance value (R) of a cell (2-*j*) of a module (1-*i*) as a function firstly of a variation in the voltage (V2–V1) across the terminals of said module over a selected time interval (t2–t1), and of a variation in the current (I2–I1) through said battery (B) in said time interval (t2–t1).

12. Apparatus according to claim 1, including a memory (9) suitable for storing nominal values and certain nominal parameters of cells involved in each of said correction factors.

13. Apparatus according to claim 12, in which said memory (9) is suitable for storing at least some of the determined values.

14. Apparatus according to claim 1, including a communications interface (11) coupled with said control means (4).

15. Apparatus according to claim 1, including a switch (6) arranged to allow or prevent current to flow through said battery (B) as a function of instructions received from said control means (4).

16. Apparatus according to claim 1, including detector means (10) arranged to detect the presence of an external system connected to the terminals of said battery (B).

17. Apparatus according to claim 16, in which said system is selected from a group comprising: a battery charger; and apparatus constituting a load.

18. A battery assembly (E) comprising at least one battery (B) together with control apparatus according to claim 1.

19. A battery assembly according to claim 18, in which each secondary electrochemical cell (2-*j*) is selected from a group comprising: at least alkaline cells and lithium cells.

20. A battery assembly according to claim 19, wherein alkaline cells comprise at least one of nickel/metal hydride (Ni/MH) cells and nickel/cadmium (Ni/Cd) cells.

21. A battery assembly according to claim 19, wherein lithium cells comprise lithium/ion (Li/ion) cells.

* * * * *